United States Patent [19]

Sato et al.

[11] Patent Number: 4,686,395

[45] Date of Patent: Aug. 11, 1987

[54] CURRENT SWITCHING TYPE LOGIC CIRCUIT

[75] Inventors: Fumihiko Sato; Kazuyoshi Yamada, both of Tokyo, Japan

[73] Assignee: NEC Corporation, Japan

[21] Appl. No.: 760,326

[22] Filed: Jul. 29, 1985

[30] Foreign Application Priority Data

Aug. 9, 1984 [JP] Japan .................................. 59-167131

[51] Int. Cl.[4] .................. H03K 19/003; H03K 19/086
[52] U.S. Cl. .................................... 307/455; 307/310; 307/362; 307/443
[58] Field of Search ............... 307/443, 455, 467, 362, 307/549, 561, 310, 264

[56] References Cited

U.S. PATENT DOCUMENTS 3,569,746  3/1971  Lacour ................................. 307/455
3,622,799  11/1971  Marley et al. ........................ 307/310
3,649,844  3/1972  Kroos .................................. 307/455

OTHER PUBLICATIONS

The ECL Handbook Section Selector, 1974, Jul., P2-7, FIG. 2-9.

Primary Examiner—John Zazworsky
Attorney, Agent, or Firm—Laff, Whitesel, Conte & Saret

[57] ABSTRACT

A current switching type logic circuit is configured as a current switching circuit comprising a differential amplifier circuit and a constant current source. The differential amplifier circuit comprises a pair of transistors of which emitters are commonly connected to the constant current source. The current switching circuit is provided with two load resistors connected to the collectors of the transistors and two shunt circuits connected in parallel with the two load resistors, respectively, each shunt circuit comprising a diode and a resistor. In response to an input signal and a reference voltage applied to the bases of the transistors constituting the differential amplifier circuit, the current switching circuit effects a switching operation to produce a logic voltage as a voltage appearing across the load resistor. By setting the resistance of the shunt resistor at a suitable value, an adjustment of temperature characteristic of an anode-cathode voltage of the diode provided in the shunt circuit is made, thereby enabling the logic voltage to have a desired temperature characteristic. Usually, the logic circuit further comprises a level shift circuit of emitter follower type. Accordingly, such an adjustment of the resistance value of the shunt resistor also makes it possible that the output low level voltage produced from the level shift circuit has different temperature characteristics.

21 Claims, 4 Drawing Figures

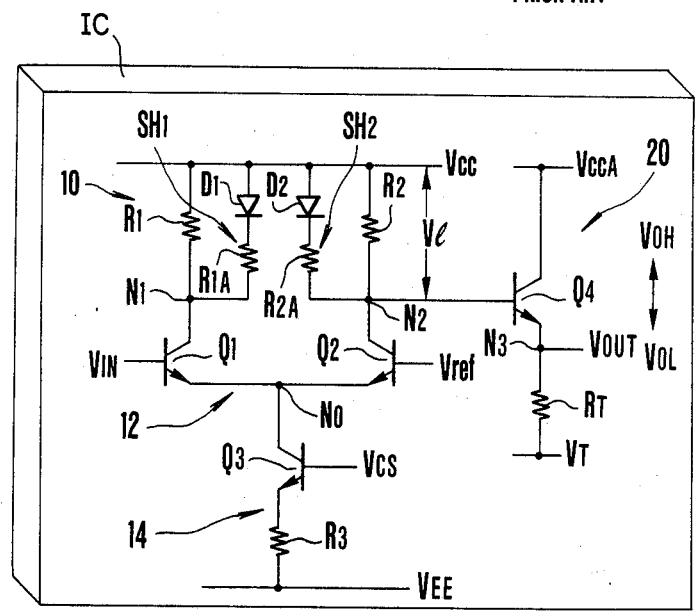
F I G. 2

CURRENT SWITCHING TYPE LOGIC CIRCUIT

BACKGROUND OF THE INVENTION

The present invention relates to a current switching type logic circuit, and more particularly to a logic circuit having a function to control temperature characteristics of a logic voltage produced therefrom by adjusting a resistor provided in a shunt circuit including a diode, connected to a load resistor. Specifically, the present invention is concerned with a current switching type logic circuit wherein a function to control temperature characteristics of logic voltage is provided, thereby enabling controlling of temperature characteristics of and output low level voltage produced from a level shift circuit provided at the output stage.

For controlling temperature dependency over a swingable range of a logic voltage in the conventional current switching type logic cicuits, there has been employed a method of controlling a voltage source for applying a voltage to the base of a transistor constituting a constant current source.

FIG. 1 is a circuit diagram showing an example of a conventional current switching type logic circuit such as disclosed in "THE ECL HANDBOOK SECTION SELECTOR", 1974, July, p 2-7, FIGS. 2-9.

The current switching type logic circuit comprises a current switching circuit 10 and a level shift circuit 20 coupled to the output stage thereof. The current switching circuit 10 includes a differential amplifier circuit 12 and a constant current source 14. The differential amplifier circuit 12 comprises a pair of npn transistors $Q_1$ and $Q_2$ of which emitters are commonly connected to a node $N_0$. The transistor $Q_1$ has a collector connected to a node $N_1$ and a base to which an input signal $V_{IN}$ is applied. Likewise, the transistor $Q_2$ has a collector connected to a node $N_2$ and a base to which a reference voltage $V_{ref}$ is applied. The constant current source 14 includes an npn transistor $Q_3$ having a collector connected to the node $N_0$, a base to which a voltage $V_{CS}$ from a voltage source for a constant current control is applied, and an emitter connected to a power source $V_{EE}$ through a resistor $R_3$. The current switching circuit 10 is further provided with two load resistors $R_1$ and $R_2$. One end of each of the resistors $R_1$ and $R_2$ is connected to the respective nodes $N_1$ and $N_2$, and the other end is connected to a power source $V_{CC}$. Thus, in response to the input signal $V_{IN}$ and the reference voltage $V_{ref}$, the current switching circuit 10 effects a switching operation to produce a logic amplitude $V_l$ swingable within a predeterminded range as a voltage appearing across the load resistor $R_2$.

Further, the level shift circuit 20 is configured as an emitter follower circuit comprising an npn transistor $Q_4$. The transistor $Q_4$ has a collector connected to a power source $V_{CC4}$, a base connected to the node $N_2$ of the current switching circuit 10, and an emitter connected to an output node $N_3$ and to a power source $V_T$ through a terminating resistor $R_T$. Thus, the level shift circuit 20 is operative to level-shift the logic voltage from the current switching circuit 10 to produce an output voltage $V_{OUT}$ swingable between an output high level voltage $V_{OH}$ and an output low level voltage $V_{OL}$.

In the circuit thus configured, assuming that a voltage between the base and the emitter of the transistor $Q_3$ is represented by $V_{BE(Q3)}$, the logic amplitude $V_l$ is expressed as follows:

$$V_l = (V_{CS} - V_{BE(Q3)}) \times (R_2/R_3) \quad (1)$$

The temperature characteristic of the logic voltage $V_l$ is determined depending on temperature change characteristics of the voltages $V_{BE(Q3)}$ and $V_{CS}$, which generally decrease according as temperature increases.

Because the voltage $V_{BE(Q3)}$ is physically determined, it is required to control the temperature characteristic of $V_l$ by the voltage $V_{CS}$. For this reason, the drawback with the conventionall circuit is that it is impossible to obtain logic amplitude $V_l$ or output low level voltage $V_{OL}$ having different temperature characteristics by using a voltage $V_{CS}$ from the same voltage source for constant current control.

SUMMARY OF THE INVENTION

With above in view, an object of the present invention is to provide a current switching type logic circuit which can produce logic voltages having different temperature characteristics with the same voltage source for constant current control, by simply adding a shunt circuit including a diode in parallel with a load resistor.

Another object of the present invention is to provide a current switching type logic circuit which can easily control temperature characteristic of a logic voltage by only adjusting resistance value of the shunt circuit.

A further object of the present invention is to provide a current switching type logic circuit which can ensure that an output low level voltage produced from a level shift circuit provided at its output stage has also different temperature characteristics.

A still further object of the present invention is to provide a current switching type logic circuit which can be interfaced with other logics having various temperature characteristics.

A still more further object of the present invention is to easily manufacture a plurality of logic circuits operative to produce a logic voltage or an output low level voltage having different temperature characteristics by integrated circuit techniques.

Accordingly, there is provided a current switching type logic circuit comprising: current switching circuit means including a differential amplifier circuit and a constant current source, the differential amplifier circuit having two input points to which an input signal and a reference voltage are applied, respectively, and two output points, the current switching circuit means being provided with two load resistors, one end of each load resistor being connected to the respective output points of the differential amplifier circuit and the other end being connected to a power source, and operative to produce a logic voltage swingable within a predetermined range as a voltage appearing across either of the two load resistors; and at least two shunt circuits connected in parallel with the two load resistors, respectively, each shunt circuit including a diode and a shunt resistor, each diode being connected in a forward direction with respect to the power source, thus allowing both a voltage between the anode and the cathode of each diode varying as a function of temperature and a resistance value of each shunt resistor to be effective as correction factors when the swingable range of the logic voltage is determined, thereby enabling the logic voltage to have desired temperature characteristics.

The differential amplifier circuit may comprise a pair of npn transistors having respective emitters commonly connected to the constant current source.

The constant current source may include a transistor coupled to a voltage source for a constant current control. Even when a voltage of the voltage source for the constant current control of the constant current source has a single temperature characteristic, an adjustment is made such that the resistance of each shunt resistor is set at different values, thereby enabling the logic voltage to have desired temperature characteristics.

When either transistor of the differential amplifier circuit is conductive, the swingable i.e., amplitude $V_l$ range of the logic voltage is determined based on a relationship expressed as follows;

$$V_l = (V_{CS} - V_{BE(Q3)}) \times (R/R_3) \times \{1 - (V_l - V_{D(D2)})/R_X\} \quad (2)$$

where $V_l$ denotes the logic amplitude, $V_{CS}$ the supply voltage for the constant current control, $V_{BE(Q3)}$ a voltage between the base and the emitter of a transistor provided in the constant current source, R a resistance value of each load resistor, $R_3$ a resistance value of a resistor provided in the constant current source, $V_{D(D2)}$ the voltage between the anode and the cathode of each diode, and $R_X$ a resistance value of each shunt resistor.

The current switching type logic circuit may further comprise a level shift circuit for level-shifting the logic voltage. The level shift circuit may be configured as an emitter follower circuit.

The emitter follower circuit constituting the level shift circuit is operative to produce an output voltage swingable between an output high level voltage and an output low level voltage. The output low level voltage has a temperature characteristic virtually identical to that of the supply voltage for the constant current control. Thus, an adjustment is made such that the resistance of each shunt resistor is set at different values, thereby enabling the output low level voltage to have a plurality of temperature characteristics.

Further, a plurality of logic circuits may be provided on a master slice to select wiring of the shunt circuit with respect to load resistor of each logic circuit, thus allowing each output low level voltage to have a desired temperature characteristic.

BRIEF DESCRIPTION OF THE DRAWINGS

The features and advantages of a current switching type logic circuit according to the present invention will become more apparent from the following description taken in conjunction with the accompanying drawings, in which:

FIG. 2 is a circuit diagram showing an embodiment of a current switching type logic circuit according to the present invention;

DETAILED DESCRIPTION OF PREFERRED EMBODIMENT

Figure 1:
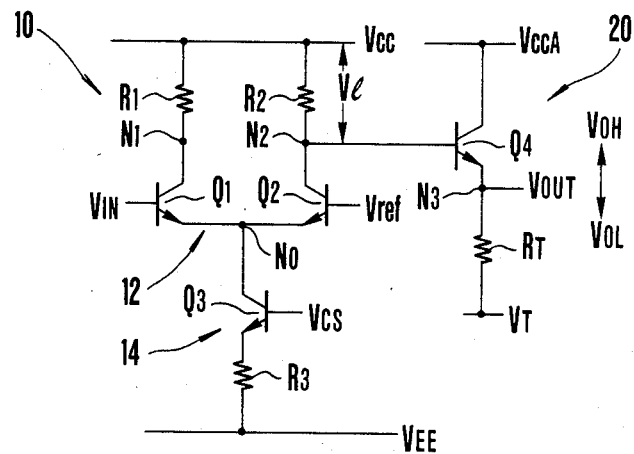
FIG. 1 is a circuit diagram showing an example of a conventional current switching type logic circuit.

A preferred embodiment of the present invention will be described with reference to attached drawings.

FIG. 2 is a circuit diagram illustrating a preferred embodiment of a current switching type logic circuit according to the present invention. The elementary circuit configuration of the logic circuit shown in FIG. 2 is the same as the logic circuit shown in FIG. 1 with the only exception that two shunt circuits $SH_1$ and $SH_2$ are connected in parallel with the two load resistors $R_1$ and $R_2$, respectively. The first shunt circuit $SH_1$ comprises a diode $D_1$ and a shunt resistor $R_1 A$ which are connected in series. Likewise, the second shunt circuit $SH_2$ comprises a diode $D_2$ and a shunt resistor $R_{2A}$ which are connected in series. The diodes $D_1$ and $D_2$ are connected in a forward direction with respect to the power supply $V_{CC}$, respectively. The setting is made such that the resistor $R_1$ has the same resistance value as the resistor $R_2$, and the diode $D_1$ has the same anode-cathode voltage as the diode $D_2$. As understood from the foregoing description, this logic circuit is operative in a manner that both the anode-cathode voltage of the diode $D_2$ and the resistance value of the resistor $R_{2A}$ are effective as correction factors when the swingable range of a logic voltage is determined, thus enabling the logic voltage to have a desired temperature characteristic.

In the circuit of the embodiment thus configured, when the transistor $Q_2$ is conductive, the swingable range of the logic amplitude V is determined in accordance with the relationship expressed as follows:

$$V_l = (V_{CS} - V_{BE(Q3)}) \times (R_2/R_3) \times \{1 - (V_l - V_{D(D2)})/R_{2A}\}$$

where $V_{D(D2)}$ is voltage between the anode the cathode of the diode $D_2$. The voltage $V_D(D_2)$ has a temperature characteristic such that its value decreases according as temperature increases. Accordingly, by setting a resistance of the resistor $R_{2A}$ at a suitable value, an adjustment of temperature characteristic of the voltage $V_{D(D2)}$ is made, thereby enabling a control of temperature characteristic of the logic amplitude $V_l$.

The above discussion has been directed to the case where an adjustment of resistance value of the shunt resistor provided in the shunt circuit newly added is made, thereby enabling a logic voltage obtained as an output of the current switching circuit 10 to have different temperature characteristics. However, it will be readily understood from the following analysis that the above discussion can be also applicable to the case where an output of the entire logic circuit including the level shift circuit is handled by assuming a simple qualitative relationship between some circuit parameters.

Usually, the output of the current switching circuit is level-shifted by the emitter follower. As a result, a logic voltage thus level-shifted is obtained. Namely, in the circuits shown in FIGS. 1 and 2, the output voltage is obtained as an output level at the emitter of the transistor $Q_4$ constituting the emitter follower. Since such a logic circuit is usually interfaced with other logics, there are some instances that it is required for the logic circuit to have different temperature characteristics.

Figure 3:
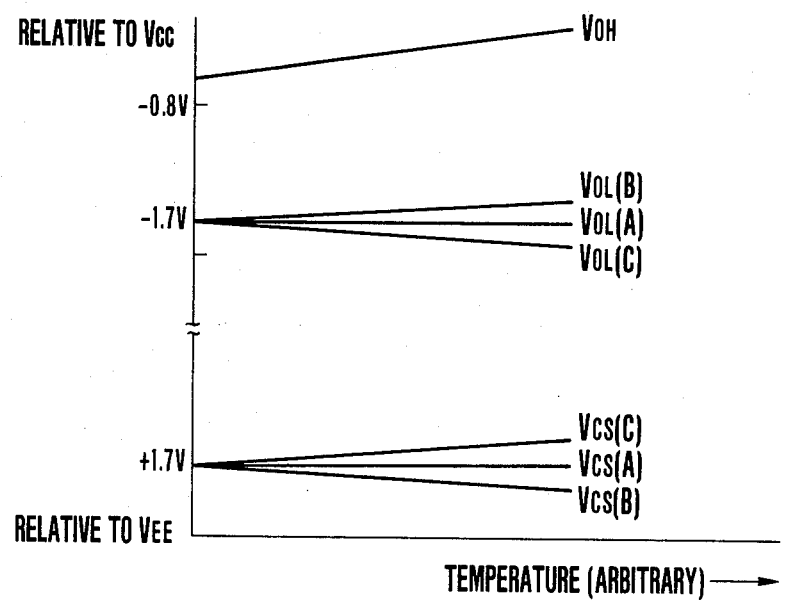
FIG. 3 is a graph showing the temperature characteristics of a voltage $V_{CS}$ for a constant current control and an output low level voltage $V_{OL}$ in the conventional current switching type logic circuit.

FIG. 3 is a graph showing temperature characteristics of a voltage of constant current source $V_{CS}$ and an output low level voltage $V_{OL}$ when the conventional logic circuit as shown in FIG. 1 is employed. As seen from FIG. 3, in the case where it is required that three kinds of output low level voltages ($V_{OL}(B)$, $V_{OL}(A)$, $V_{OL}(C)$) have temperature characteristics different from each other, three kinds of voltages ($V_{CS}(C)$, $V_{CS}(A)$, $V_{CS}(B)$) for constant current control having temperature characteristics different from each other are required.

In view of this, the following discussion is made. In general, an output low level voltage $V_{OL}$ is expressed as follows:

$$V_{OL} = -V_l - V_{BE(Q4)} \quad (3)$$
$$= -R_3/R_2(V_{CS} - V_{BE(Q3)}) - V_{BE(Q4)}$$

where $V_{BE(Q4)}$ is a voltage between the base and the emitter of the transistor $Q_4$. Assuming now that $R_3 = R_2$ and current densities of the transistors $Q_3$ and $Q_4$ are equal to each other, the output low level voltage $V_{OL}$ is expressed as follows:

$$V_{OL} = -(V_{CS}V_{BE(Q4)}) = -V_{CS} \quad (4)$$

The temperature characteristic of the voltage $V_{CS}$ for constant current control is substantially identical to that of the output low level voltage $V_{OL}$. Accordingly, in order to realize several temperature characteristics using the same master slice on which a plurality of IC (integrated circuits) chip etc. are formed, power sources for $V_{CS}$ corresponding to respective temperature characteristics are required. In general, a power supply circuit for generating the voltage $V_{CS}$ requires capacitance sufficient to prevent oscillation, resulting in large occupation area within the integrated circuit. Accordingly, it is not preferable from a viewpoint of chip area that there exist several power source circuits in a complicated manner.

Figure 4:
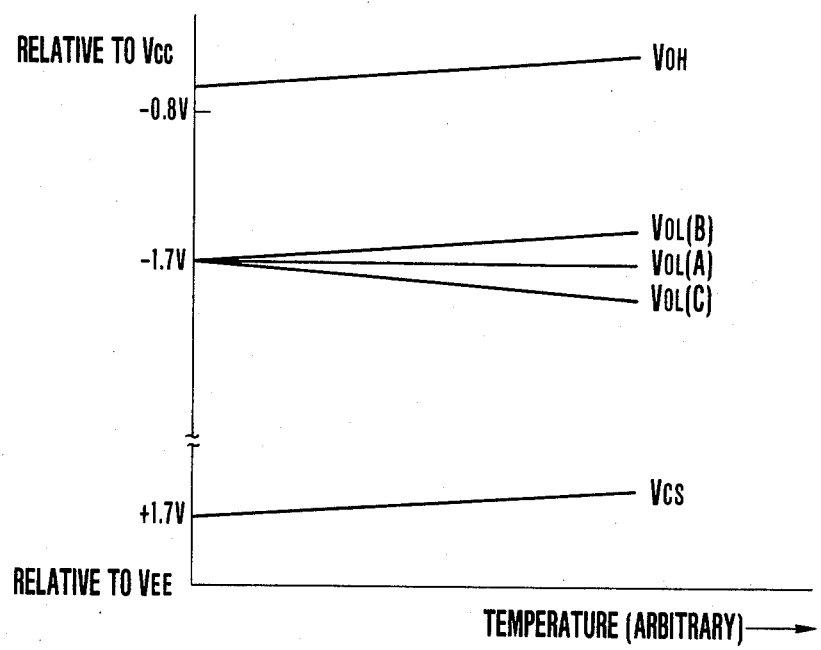
FIG. 4 is a graph showing temperature characteristics of a voltage $V_{CS}$ for a constant current control and an output low level voltage $V_{OL}$ in the current switching type logic circuit according to the present invention.

In contrast, the present invention enables an output low level voltage to have different temperature characteristics by using a single voltage $V_{CS}$ for constant current source as shown in FIG. 4. Namely, when the resistance of the resistor $R_{2A}$ is set at a small value, a bypassing current flowing through the diode $D_2$ in the shunt circuit $SH_2$ is increased. Thus, the logic amplitude $V_l$ is likely to have the influence on the temperature characteristic of the diode $D_2$ as estimated by the equation (2). Accordingly, the anode-cathode voltage $V_{D(D2)}$ of the diode $D_2$ becomes small according as temperature increases, with the result that the logic amplitude $V_l$ decreases. As a result, the output low voltage level $V_{OL}$ increases according as temperature increases, thus providing a temperature characteristic as indicated by $V_{OL(B)}$ (FIG. 4).

On the other hand, when the resistance of the resistor $R_{2A}$ is set at a large value, a bypassing current flowing through the diode $D_2$ in the shunt circuit $SH_2$ becomes small. As a result, the output of the level shift circuit has a temperature characteristic similar to the temperature characteristic obtained with the conventional circuit which is not provided with the shunt circuit. Namely, in this instance, a temperature characteristic as indicated by $V_{OL}(C)$ (FIG. 4) is obtained. Further, by suitably selecting the value of the resistor $R_{2A}$, it is possible to obtain the temperature characteristic as indicated by $V_{OL(A)}$ (FIG. 4).

Accordingly, when the above-mentioned logic circuit provided with the shunt circuit is configured as an integrated circuit IC, such elements are prepared on a master slice to simply effect wiring changes of the shunt circuits, thus making it possible to obtain an output low level voltage having a desired temperature characteristic. Further, the shunt circuit newly added by the present invention is easily configured with a diode and a resistor, resulting in small area occupation therefor. Furthermore, in accordance with the novel circuit configuration of the invention, there is no resistor or diode between collectors of the transistors $Q_1$ and $Q_2$. Accordingly, the independency of the transistors $Q_1$ and $Q_2$ is not impaired, thus facilitating to obtain a voltage difference between these transistors $Q_1$ and $Q_2$. In addition, the setting of the output high level voltage $V_{OH}$ can be made without being affected by the diodes $D_1$ and $D_2$.

As stated above in detail, the current switching type logic circuit according to the present invention makes it possible to easily control temperature characteristics of a logic voltage or an output low level voltage by simply adding the shunt circuit comprising a diode and a resistor to the load resistor so that it is connected in parallel therewith.

What is claimed is:

1. A current switching type logic circuit comprising;
    current switching circuit means including a differential signal input means and a constant current source, said differential signal input means having a pair of input points to which a voltage difference is applied, a pair of output points, and a pair of load elements connected between said output points and a power source; and
    a pair of shunt circuits each connected in parallel with each of said load elements each of said shunt circuits including a diode and a resistive element connected in series, each of said diodes being connected in a forward direction with respect to said power source.

2. A current switching type logic circuit as set forth in claim 1, wherein said differential signal input means comprises a pair of transistors commonly connected to said constant current source.

3. A current switching type logic circuit as set forth in claim 2, wherein each of said pair of transistors is comprised of an npn transistor.

4. A current switching type logic circuit as set forth in claim 3, wherein one of said pair of transistors has a base to which said input signal is applied, and a collector connected to the one output point which is connected to one of said two load elements, the other of said pair of transistors having a base to which said reference voltage is applied, and a collector connected to the other output point which is connected to the other of said two load elements, emitters of said pair of transistors being commonly connected to a first node.

5. A current switching type logic circuit as set forth in claim 1, wherein said constant current source includes a transistor coupled to a voltage source for a constant current control.

6. A current switching type logic circuit as set forth in claim 5, wherein said voltage source for the constant current control of said constant current source has a single temperature characteristic.

7. A current switching type logic circuit as set forth in claim 6, wherein a resistance of each resistive element is adjusted to be at different values, thereby enabling a logic amplitude across the load element to have desired temperature characteristics.

8. A current switching type logic circuit as set forth in claim 4, wherein said constant current source comprises a first transistor of npn type having a collector connected to said first node, a base to which a supply voltage for constant current control is applied and an emitter, and a first resistor connected in series between said emitter of said first transistor and a second power source.

9. A current switching type logic circuit as set forth in claim 8, wherein when either transistor of the differential signal input means is conductive, a logic amplitude across the load element is determined based on a relationship expressed as follows;

$$V_l = (V_{CS} - V_{BE(Q3)}) \times \{1 - (V_l V_{D(D2)})/R_X\}$$

where $V_l$ denotes the logic amplitude, $V_{CS}$ the supply voltage for the constant current control, $V_{BE(Q3)}$ a voltage between said base and said emitter of said first transistor, $R_3$ a resistance value of each of said two load elements, $R_3$ a resistance value of said first resistor, $V_D$ the voltage between said anode and said cathode of each of said diodes, and $R_X$ a resistance value of each of said resistive elements.

10. A current switching type logic circuit as set forth in claim 9, wherein said supply voltage for the constant current control, said voltage between said base and said emitter of said first transistor, and said voltage between said anode and said cathode of each of said diodes have temperature characteristics such that their voltage values decrease according as temperature increases, respectively.

11. A current switching type logic circuit as set forth in claim 1, which further comprises a level shift circuit for level-shifting said logic voltage.

12. A current switching type logic circuit as set forth in claim 11, wherein said level shift circuit is configured as an emitter follower circuit.

13. A current switching type logic circuit as set forth in claim 12, wherein said emitter follower circuit comprises an npn transistor having a base coupled to one of said output points of said current switching circuit means, a collector connected to a third power source, and an emitter connected to a fourth power source through a terminating resistor.

14. A current switching type logic circuit as set forth in claim 13, wherein said emitter follower circuit constituting said level shift circuit is operative to produce an output voltage swingable between an output high level voltage and an output low level voltage.

15. A current switching type logic circuit as set forth in claim 14, wherein said output low level voltage has a temperature characteristic virtually identical to that of said supply voltage for the constant current control.

16. A current switching type logic circuit as set forth in claim 15, wherein a resistance of each of said resistive elements is adjusted to be at different values, thereby enabling said output low level voltage to have desired temperature characteristics.

17. A current switching type logic circuit as set forth in claim 2, wherein each of said pair of transistors is comprised of a pnp transistor.

18. A current switching type logic circuit as set forth in claim 5, wherein said transistor constituting said constant current source is comprised of a pnp transistor.

19. A current switching type logic circuit as set forth in claim 12, wherein said emitter follower circuit constituting said level shift circuit comprises a pnp transistor.

20. A current switching type logic circuit as set forth in claim 1 wherein said logic circuit is configured as an integrated circuit.

21. A current switching type logic circuit as set forth in claim 20, wherein a plurality of said logic circuits are provided on a master slice to select wiring changes of said shunt circuits with respect to load elements of each logic circuit, thus allowing each of said output low level voltages to have a desired temperature characteristics.

* * * * *